(12) United States Patent
Takeuchi et al.

(10) Patent No.: US 9,153,628 B2
(45) Date of Patent: Oct. 6, 2015

(54) DISPLAY PANEL HAVING AN INTER-LAYER INSULATION LAYER WITH PLANAR AND PROTRUDING REGIONS

(71) Applicant: JOLED INC., Tokyo (JP)

(72) Inventors: Takayuki Takeuchi, Hyogo (JP); Sadayoshi Hotta, Osaka (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/375,250

(22) PCT Filed: Jan. 31, 2013

(86) PCT No.: PCT/JP2013/000542
§ 371 (c)(1),
(2) Date: Jul. 29, 2014

(87) PCT Pub. No.: WO2013/118474
PCT Pub. Date: Aug. 15, 2013

(65) Prior Publication Data
US 2014/0367669 A1 Dec. 18, 2014

(30) Foreign Application Priority Data

Feb. 8, 2012 (JP) ................ 2012-025054

(51) Int. Cl.
*H01L 27/32* (2006.01)
*H01L 51/56* (2006.01)
*H01L 51/50* (2006.01)

(52) U.S. Cl.
CPC ........ *H01L 27/3211* (2013.01); *H01L 27/3246* (2013.01); *H01L 27/3258* (2013.01); *H01L 27/3276* (2013.01); *H01L 51/5088* (2013.01); *H01L 51/56* (2013.01)

(58) Field of Classification Search
CPC ............ H01L 27/3211; H01L 27/3246; H01L 27/3276; H01L 51/5088; H01L 51/56
See application file for complete search history.

(56) References Cited

U.S. PATENT DOCUMENTS

| 5,443,922 | A | | 8/1995 | Nishizaki et al. | |
|---|---|---|---|---|---|
| 6,057,557 | A | * | 5/2000 | Ichikawa | 257/59 |
| 6,281,552 | B1 | * | 8/2001 | Kawasaki et al. | 257/350 |
| 6,294,441 | B1 | * | 9/2001 | Yamazaki | 438/486 |
| 6,822,708 | B2 | * | 11/2004 | Fujino | 349/113 |
| 7,312,571 | B2 | * | 12/2007 | Kim | 313/506 |

(Continued)

FOREIGN PATENT DOCUMENTS

| JP | 05-163488 | 6/1993 |
|---|---|---|
| JP | 2001-035663 | 2/2001 |

(Continued)

OTHER PUBLICATIONS

International Search Report (ISR) in International Patent Application No. PCT/JP2013/000542, dated May 14, 2013.

*Primary Examiner* — Ida M Soward
(74) *Attorney, Agent, or Firm* — Greenblum & Bernstein, P.L.C.

(57) ABSTRACT

A display panel where, within at least one aperture, an inter-layer insulation layer includes a planar region having a planar surface and a protruding region having a protruding surface relative to the planar region located wherever two or more of a gate electrode, a drain electrode, a source electrode, a first power supply signal wiring, and a second power supply signal wiring intersect, and an insulation film covers at least part of the protruding region and does not cover at least part of the planar region.

19 Claims, 14 Drawing Sheets

(56) References Cited

U.S. PATENT DOCUMENTS

| | | | |
|---|---|---|---|
| 7,352,421 B2* | 4/2008 | Nakahori et al. | 349/114 |
| 7,456,431 B2* | 11/2008 | Um et al. | 257/72 |
| 7,507,609 B2* | 3/2009 | Koo et al. | 438/149 |
| 7,667,390 B2* | 2/2010 | Wu | 313/506 |
| 7,795,808 B2* | 9/2010 | Matsuura et al. | 313/506 |
| 8,253,131 B2 | 8/2012 | Takeuchi | |
| 8,344,362 B2* | 1/2013 | Kitabayashi et al. | 257/40 |
| 8,426,870 B2 | 4/2013 | Kanegae et al. | |
| 8,487,395 B2 | 7/2013 | Kanegae et al. | |
| 8,524,328 B2 | 9/2013 | Takeuchi | |
| 8,896,639 B2* | 11/2014 | Yamazaki et al. | 345/87 |
| 2003/0142253 A1* | 7/2003 | Takenaka | 349/113 |
| 2004/0066477 A1* | 4/2004 | Morimoto et al. | 349/113 |
| 2004/0090175 A1* | 5/2004 | Urabe et al. | 313/504 |
| 2005/0186359 A1* | 8/2005 | Ishizuka et al. | 428/1.1 |
| 2005/0190322 A1* | 9/2005 | Okabe et al. | 349/113 |
| 2005/0218404 A1* | 10/2005 | Fujino | 257/59 |
| 2007/0097282 A1* | 5/2007 | Hashiguchi et al. | 349/43 |
| 2007/0109473 A1* | 5/2007 | Higa et al. | 349/114 |
| 2007/0122923 A1* | 5/2007 | Kho et al. | 438/21 |
| 2008/0036705 A1 | 2/2008 | Iwashita et al. | |
| 2010/0078627 A1 | 4/2010 | Yoshinaga | |
| 2010/0295831 A1 | 11/2010 | Iwashita et al. | |
| 2011/0227896 A1* | 9/2011 | Hwang | 345/211 |
| 2014/0197417 A1 | 7/2014 | Nanai et al. | |

FOREIGN PATENT DOCUMENTS

| | | |
|---|---|---|
| JP | 2007-250244 | 9/2007 |
| JP | 2008-071671 | 3/2008 |
| JP | 2008-098148 | 4/2008 |
| JP | 2008-103253 | 5/2008 |
| JP | 2009-218225 | 9/2009 |

* cited by examiner

DISPLAY PANEL HAVING AN INTER-LAYER INSULATION LAYER WITH PLANAR AND PROTRUDING REGIONS

TECHNICAL FIELD

The present disclosure pertains to a display panel such as an organic electroluminescence panel, and to a manufacturing method therefor.

BACKGROUND ART

In recent years, organic electroluminescence display panels (hereinafter also organic EL display panels) in which organic electroluminescence elements are disposed on a substrate have become widespread as display devices. An organic electroluminescence display panel has high visibility due to using organic electroluminescence elements that emit light, and additionally has excellent shock-resistance due to the elements being entirely solid-state components.

An organic electroluminescence element is a current-driven light-emitting element, in which functional layers, such as a light-emitting layer making use of the organic material electroluminescence effect through recombination of carriers (i.e., of holes and electrons), are stacked between a pair of electrodes, namely an anode and a cathode. Also, an organic EL panel has organic EL elements respectively corresponding to sub-pixels in red (R), green (G), and blue (B). A combination of three sub-pixels R, G, and B forms one pixel.

CITATION LIST

Patent Literature

[Patent Literature 1]
Japanese Unexamined Patent Application Publication No. 2009-218225

SUMMARY OF INVENTION

Technical Problem

As it happens, such an organic electroluminescence display panel may have a portion within a light-emitting region of a given sub-pixel in which current density is uneven. Portions with higher current density have more current flowing therethrough. Thus, degradation of the light-emitting layer progresses in such portions and reduces the useful lifespan, eventually leading to the formation of a local non-light-emitting region. Once a local non-light-emitting region is formed, the amount of light emitted from pixels decreases as the non-light-emitting region expands over time.

In consideration of the above-described problem, the present disclosure seeks to provide technology enabling constraint of decrease in the amount of emitted light from the light-emitting regions of sub-pixels.

Solution to Problem

A display panel pertaining to one aspect of the disclosure includes an inter-layer insulation layer, a partition layer arranged above the inter-layer insulation layer and partitioning plurality of apertures in the matrix, a pixel electrode formed above the inter-layer insulation layer for each of the apertures, a light-emitting layer formed above the pixel electrode in each of the apertures, and an insulation film formed between the pixel electrode and the light-emitting layer, the inter-layer insulation layer has a portion within at least one of the apertures in which are formed, as seen in a plan view, a planar region having a planar surface, and a protruding region having a protruding surface taller than the planar region, and the insulation film covers at least part of the protruding region and does not cover at least part of the planar region.

Advantageous Effects of Invention

The display panel pertaining to an aspect of the disclosure has a insulation film covering the top of a protruding region between the pixel electrode and the light-emitting layer. A corresponding portion above the protruding region is thus electrically insulated between the pixel electrode and the light-emitting layer, preventing current flow in the light-emitting layer at a corresponding position above the region where the insulation film is formed. Accordingly, the current density is uneven in a reduced surface area, which enables constraining of the decrease in emitted light.

BRIEF DESCRIPTION OF DRAWINGS

FIG. 2A is taken along line A-A' of FIG. 6 and FIG. 2B is taken along line B-B' of FIG. 6.

FIG. 8A shows the TFT layer formed over the substrate, FIG. 8B shows the inter-layer insulation layer formed over the TFT layer, and FIG. 8C shows the pixel electrode formed over the inter-layer insulation layer.

FIG. 9A shows the insulation film formed over the pixel electrode and FIG. 9B shows the partition layer formed over the inter-layer insulation layer and the pixel electrode.

FIG. 10A shows a hole injection layer and a hole transport layer formed over the insulation film and FIG. 10B shows the light-emitting layer formed over the hole transport layer.

FIG. 11A shows an electron transport layer and a electron injection layer formed over the light-emitting layer and FIG. 11B shows a common electrode formed over the electron injection layer.

DESCRIPTION OF EMBODIMENT

Overview of Aspects

Figure 1:
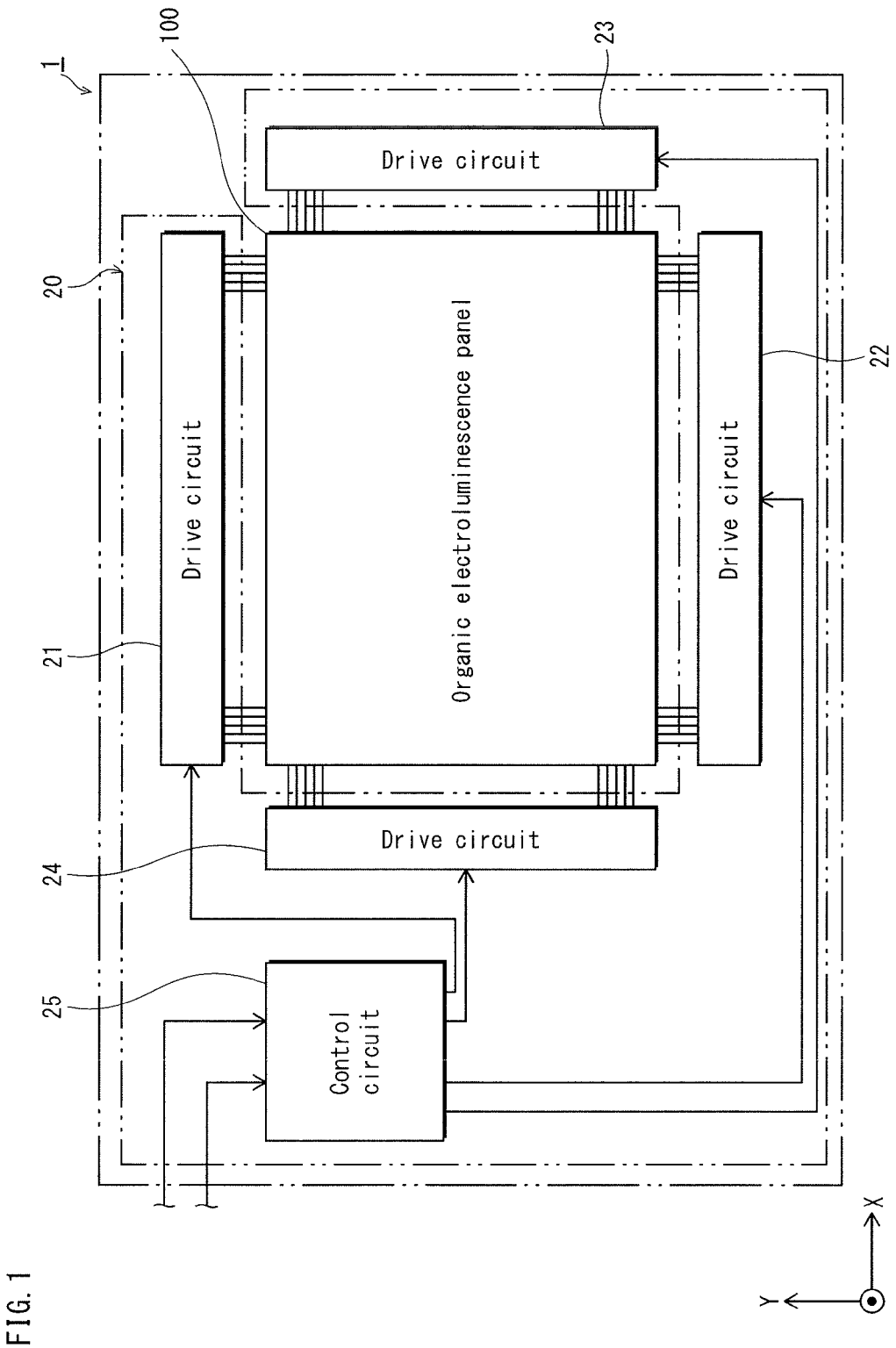
FIG. 1 is a schematic block diagram indicating the configuration of a display device pertaining to the Embodiment.

In one aspect, a display panel comprises a transistor array in which a plurality of drive units each including a thin-film transistor are arranged in a matrix, the thin-film transistor including a gate electrode, a gate insulation film opposite the gate electrode, a semiconductor layer opposite the gate electrode across the gate insulation film, and a pair of a source electrode and a drain electrode electrically connected to the semiconductor layer; an inter-layer insulation layer arranged above the transistor array; a partition layer arranged above the inter-layer insulation layer and partitioning a plurality of apertures in the matrix; a pixel electrode arranged above the inter-layer insulation layer for each of the apertures; a light-emitting layer arranged above the pixel electrode in each of the apertures; and an insulation film arranged between the pixel electrode and the light-emitting layer, wherein the transistor array includes first power supply signal wiring arranged in a row direction and second power supply signal wiring arranged in a column direction, within at least one of the apertures, the inter-layer insulation layer includes a planar region having a planar surface and a protruding region having a protruding surface, relative to the planar region, located wherever two or more of the gate electrode, the drain electrode, the source electrode, the first power supply signal wiring, and the second power supply signal wiring intersect, and the insulation film covers at least part of the protruding region and does not cover at least part of the planar region.

The portion formed above the protruding region within the pixel electrode protrudes relative to other regions. The light-emitting layer formed above the protruding portion of the pixel electrode is thus thinner than other portions due to the protrusion. The thin portion of the light-emitting layer has more current flowing therethrough due to decreased electrical resistance. This causes brilliance flicker due to stronger light being emitted at the thin portions, and is the cause of problems such as progressing degradation. That is, the light-emitting layer has a corresponding portion above the protruding region where charge is concentrated and in which problems such as brilliance flicker and progressing degradation are expected to occur. The display panel pertaining to an aspect of the disclosure has a insulation film formed so as to cover the top of a protruding region between the pixel electrode and the light-emitting layer. A corresponding portion above the protruding region is thus electrically insulated between the pixel electrode and the light-emitting layer, preventing current flow in the light-emitting layer at a corresponding position above the region where the insulation film is formed. Accordingly, the surface area where the current density is uneven is reduced, which enables constraining of the brilliance fluctuations and decrease in luminance over time.

In another aspect, when a position on the light-emitting layer located above the planar region is illuminated, a position on the light-emitting layer located above the insulating layer is non-illuminated.

In a further aspect, the protruding region is located where the first power supply signal wiring and the second power supply signal wiring intersect, or where electrode wiring that is co-planar with the first power supply signal wiring and electrode wiring that is co-planar with the second power supply signal wiring intersect.

In an additional aspect, the protruding region is located above a position where two or more of the gate electrode, the drain electrode, and the source electrode intersect.

In yet another aspect, a hole injection layer between the pixel electrode and the light-emitting layer, wherein the insulation film is arranged between the pixel electrode and the hole injection layer.

In still another aspect, a hole injection layer between the pixel electrode and the light-emitting layer, wherein the insulation film is arranged over the hole injection layer.

In yet a further aspect, the insulation film is separated from the apertures, as seen in a plan view.

In still a further aspect, the insulation film is thinner than the partition layer, and is continuous with an aperture border, as seen in a plan view.

In another further aspect, the apertures include: a first aperture in which is disposed a first light-emitting layer emitting light of a first colour; and a second aperture in which is disposed a second light-emitting layer emitting light of a different colour than the first light-emitting layer and having greater light emission efficiency than the first light-emitting layer, and as seen in a plan view, the insulating film has a larger surface area in the first aperture relative to the second aperture.

In yet a further aspect, the light-emitting layer disposed in each of the apertures emits a colour of light that is one of red, blue, and green, and as seen in a plan view, the insulating film has a larger surface area in one of the apertures in which is disposed the light-emitting layer that emits blue light, relative to the aperture in which is disposed the light-emitting layer that emits one of red light and green light.

In an alternative aspect, as seen in a plan view, the insulating film has a larger surface area in one of the apertures in which is disposed the light-emitting layer that emits red light, relative to the apertures in which is disposed the light-emitting layer that emits green light.

In one aspect of a method, the disclosure involves preparing a substrate; forming a transistor array substrate by arranging a plurality of drive units, each including a thin-film transistor, in a matrix on the substrate, the thin-film transistor including a gate electrode, a gate insulation film opposite the gate electrode, a semiconductor layer opposite the gate electrode across the gate insulation film, and a pair of a source electrode and a drain electrode electrically connected to the semiconductor layer; forming an inter-layer insulation layer above the transistor array substrate; forming a plurality of pixel electrodes above the inter-layer insulation layer, each pixel electrode corresponding to one of the drive units in the matrix; forming an insulation film above the pixel electrodes and over part of the inter-layer insulation layer; forming a partition layer above the inter-layer insulation layer and the insulation film partitioning a plurality of apertures respectively corresponding to the pixel electrodes; and forming a light-emitting layer arranged above the insulation film in each of the apertures, wherein the transistor array includes first power supply signal wiring arranged in a row direction and second power supply signal wiring arranged in a column direction, within at least one of the apertures, the inter-layer insulation layer includes a planar region having a planar surface and a protruding region having a protruding surface, relative to the planar region, located wherever two or more of the gate electrode, the drain electrode, the source electrode, the first power supply signal wiring, and the second power supply signal wiring intersect, and the insulation film covers at least part of the protruding region and does not cover at least part of the planar region.

In another aspect, when a position on the light-emitting layer located above the planar region is illuminated, a position on the light-emitting layer located above the insulating layer is non-illuminated.

In a further aspect, the protruding region is located where the first power supply signal wiring and the second power supply signal wiring intersect.

In an additional aspect, the protruding region is located above a position where two or more of the gate electrode, the drain electrode, and the source electrode intersect.

In still a further aspect, the insulation film is thinner than the partition layer, and is continuous with an aperture border, as seen in a plan view.

In another further aspect, the apertures include: a first aperture in which is formed a first light-emitting layer emitting light of a first colour; and a second aperture in which is formed a second light-emitting layer emitting light of a different colour than the first light-emitting layer and having greater light emission efficiency than the first light-emitting layer, and as seen in a plan view, the insulating film has a larger surface area in the first aperture relative to the second aperture.

In yet another aspect, the light-emitting layer formed in each of the apertures emits a colour of light that is one of red, blue, and green, and as seen in a plan view, the insulating film formed so as to cover a protruding region intended for formation of the light-emitting layer that emits blue light has a larger surface area than the insulating film formed so as to cover a predetermined protruding region intended for formation of the light-emitting layer that emits one of red light and green light.

In a further additional aspect, as seen in a plan view, the insulating film formed so as to cover a predetermined protruding region intended for formulation of the light-emitting layer that emits red light has a larger surface area than the insulating film formed so as to cover a predetermined protruding region intended for formation of the light-emitting layer that emits green light.

Embodiment 1.1. Overall Configuration

FIG. 1 is a schematic block diagram indicating the configuration of a display device 1 equipped with a display panel 100 pertaining to the present Embodiment. As shown, the display device 1 is made up of the display panel 100 having a drive control unit 20 connected thereto. The display panel 100 makes use of the organic material electroluminescence effect, and is configured as a plurality of organic electroluminescence elements (hereinafter also organic EL elements) arranged, for example, in a matrix. The drive control unit 20 includes four drive circuits 21-24 and a control circuit 25.

No particular limitation to the arrangement of the drive control unit 20 relative to the display panel 100 is intended for the actual display device 1.

1.2. Display Panel Configuration

The configuration of the display panel 100 is described with reference to FIGS. 2A and 2B.

Figure 2A:
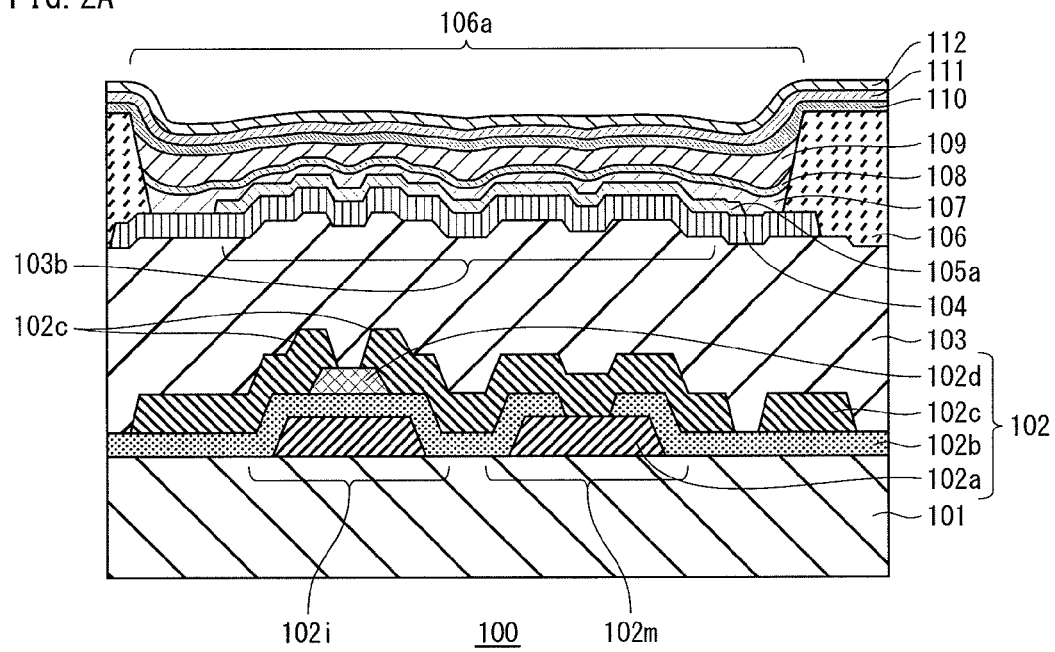
FIGS. 2A and 2B are cross-sectional diagrams schematically showing the configuration of the display panel pertaining to the Embodiment, where
Figure 2B:
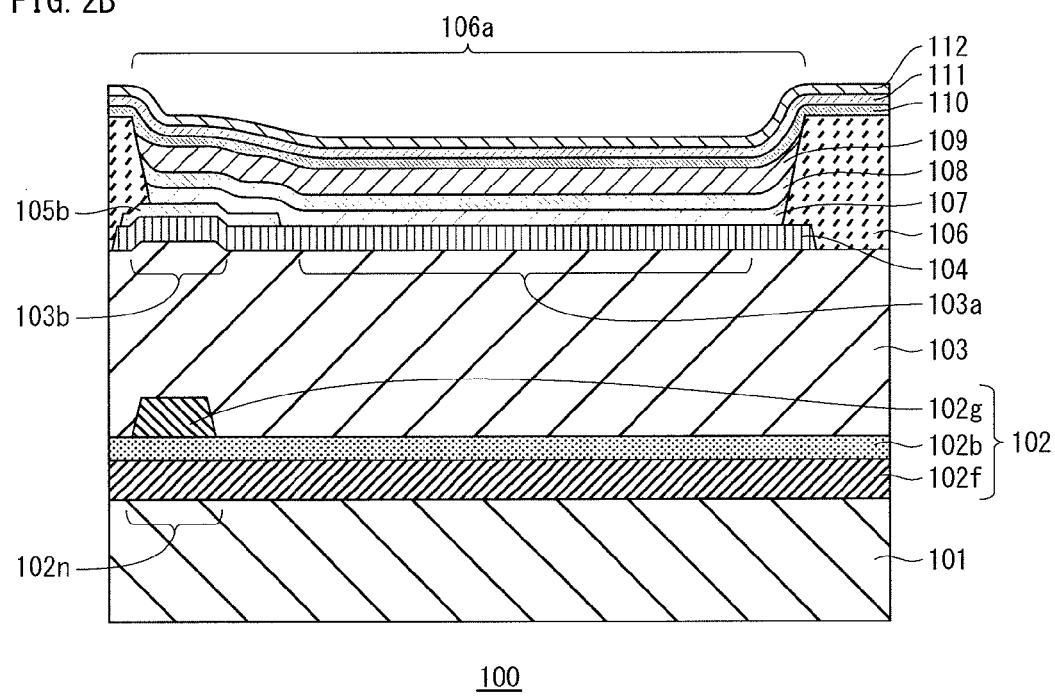
Figure 6:
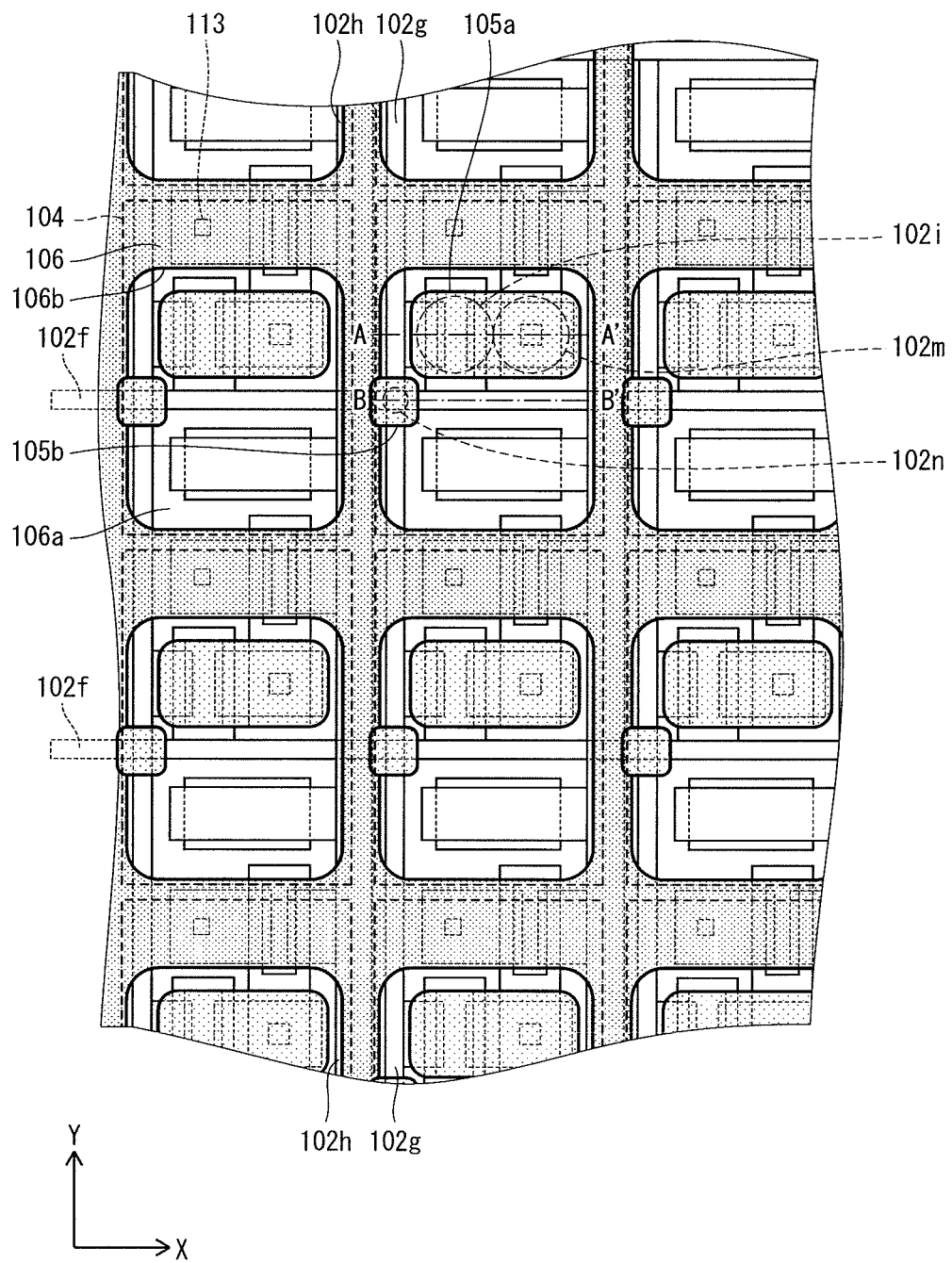
FIG. 6 is a plane-view diagram of the layout of an insulation film in the display panel pertaining to the Embodiment.

FIGS. 2A and 2B are partial cross-sectional diagrams showing the overall configuration of the display panel 100. The display panel 100 is a top-emission panel, and drawn such that the display face is the top side of the page. FIGS. 2A and 2B each illustrate a cross section of a different portion of the display panel 100. Specifically, FIG. 2A shows a cross-section taken along line A-A' of FIG. 6, and FIG. 2B shows a cross-section taken along line B-B' of FIG. 6. FIG. 6 is described in detail later.

The display panel 100 includes a substrate 101, a thin film transistor layer (hereinafter, TFT layer) 102, an inter-layer insulation layer 103, a pixel electrode 104, an insulation film 105, a partition layer 106, a hole injection layer 107, a hole transport layer 108, a light-emitting layer 109, an electron transport layer 110, an electron injection layer 111, and a common electrode 112.

<Substrate>

The substrate 101 is, for example, made of an insulating material such as a non-alkali glass, a soda glass, a non-fluorescent glass, a phosphoric glass, a boric glass, quartz, an acrylic resin, a styrene resin, a polycarbonate resin, an epoxy resin, a polyethylene resin, a polyester resin, a silicone resin, aluminium oxide, and so on.

<TFT Layer>

The TFT layer 102 is a pixel circuit that includes a TFT element, provided for each sub-pixel. As shown in FIG. 2A, the TFT layer 102 includes a gate electrode 102a, a gate insulation film layer 102b, a source electrode 102c, a drain electrode 102c, and a channel layer 102d. Also, an extraction electrode 102e is electrically connected to the pixel circuit over the TFT layer 102 (see FIG. 4). The substrate 101 with the TFT layer 102 formed thereon is termed a TFT array substrate. The source electrode and the drain electrode are not particularly distinguished in the present explanation and the same reference sign is therefore used for both types of electrode. The source electrode and the drain electrode are also commonly called a source-drain electrode.

<Inter-Layer Insulation Layer>

The inter-layer insulation layer 103 is made of an insulating material such as a polyimide resin or an acrylic resin, and serves to planarize gradations in a top face of the TFT layer 102. However, given that such gradations cannot be completely planarized, a planar region 103a and a protruding region 103b are formed such that the protruding region 103b protrudes above the planar region 103a. A contact hole (also termed contact portion) 113 is formed over each extraction electrode 102e in the inter-layer insulation layer 103 (see FIG. 4), in order to expose a portion of the top face of each extraction electrode 102e.

Between the inter-layer insulation layer 103 and the substrate 101, the TFT layer 102 and the extraction electrode 102e may be covered by a passivation film for protection, the passivation film being a thin film of SiO (silicon oxide) or SiN (silicon nitride).

The planar region 103a need not have a completely planar surface. The surface of the planar region 103a may have a concave portion formed as a concavity. The planar region 103a may also include a protrusion that is relatively flat, compared to the protruding region 103b. Specifically, given a thickness d for the light-emitting layer 109, for example, the protruding region 103b is a protrusion of at least ½ d, and any protrusion of less than ½ d may be treated as a planar region 103a. However, ½ d is not intended as a limitation to the distinction between the protruding region 103b and the planar region 103a. A larger value may be used (e.g., ⅔ d), or a smaller value may be used (e.g., ⅕ d). The degree of protrusion distinguishing the protruding region 103b from the planar region 103a may be determined as appropriate in consideration of ink properties and of application and drying processes used to print layers between partitions.

<Pixel Electrode>

The pixel electrode 104 is provided individually to each sub-pixel and is electrically connected to the extraction electrode 102e by being inserted into the contact hole 113 provided in the inter-layer insulation layer 103. The pixel electrode 104 is made of an electrically conductive material that is optically reflective, such as Ag (silver), Al (aluminium), an aluminium alloy, Mo (molybdenum), APC (an alloy of silver, palladium, and copper), ARA (an alloy of silver, rubidium, and gold), MoCr (an alloy of molybdenum and chromium), MoW (an alloy of molybdenum and tungsten), NiCr (an alloy of nickel and chromium), ACL (an alloy of aluminium, cobalt, germanium, and lanthanum), and so on.

A known light-transmissive electrically conductive film may be provided on the surface of the pixel electrode 10. The material for the light-transmissive electrically conductive film may be ITO (indium tin oxide) or IZO (indium zinc oxide), for example.

<Insulation Film>

The insulation film 105 may be formed from an organic insulating material such as a polyimide resin, an acrylic resin, and a novolac-type phenol resin, or from an inorganic insulating material such as SiO (silicon oxide) and SiN (silicon nitride). The insulation film 105 is formed over the protruding region 103b and the pixel electrode 104. Accordingly, electrical insulation is provided between the pixel electrode 104 and the light-emitting layer 109 over the protruding region 103b. A non-light-emitting region is formed over the protruding region 103b.

The same material is used for insulation film 105a shown in FIG. 2A and insulation film 105b shown in FIG. 2B, which differ only in terms of location and size. When there is no particular need to make the distinction, the term insulation film 105 is used.

Also, the same material may also be used for the later-described partition layer 106. When the same material is used, the insulation film 105 and the partition layer 106 may be formed simultaneously or may be formed individually.

<Partition Layer>

The partition layer 106 (hereinafter also termed a bank) is formed over the pixel electrode 104 and has an aperture 106a provided for each sub-pixel. The partition layer 106 is made of an insulating organic material (e.g., an acrylic resin, a polyimide resin, a novolac-type phenol resin, or similar). The partition layer 106 serves as structural material preventing spillage of ink applied when forming the light-emitting layer with an application method. The partition layer 106 also serves as structural material for placing a mask when a vapour deposition method is used to form the light-emitting layer 109.

<Hole Injection Layer>

The hole injection layer 107 is provided in order to promote injection of holes from the pixel electrode 104 into the light-emitting layer 109. The hole injection layer 107 is formed from an oxide of a metal such as Ag (silver), Mo (molybdenum), Cr (chromium), V (vanadium), W (tungsten), Ni (nickel), Ir (iridium), and so on, or from an electrically conductive polymer material such as PEDOT (a compound of polythiophene and polystyrene sulfonate) or the like. In the above description, the hole injection layer 107 made of a metal oxide has a large work function, and serves to provide holes with stability, to assist the generation of holes, and to inject the holes into the light-emitting layer 109. In the present Embodiment, the hole injection layer 107 is made of an electrically conductive polymer material such as PEDOT (a compound of polythiophene and polystyrene sulfonate).

When the hole injection layer 107 is made of a transition metal oxide, the transition metal has a plurality of possible oxidation numbers, which makes a plurality of energy levels available. As a result, hole injection is made easier and drive voltage is reduced.

<Hole Transport Layer>

The hole transport layer 108 is formed using a high-polymer compound that does not include any hydrophilic groups. For example, a high-polymer compound such as a polyfluorene, a polyfluorene derivative, a polyarylamine, a polyarylamine derivative, or similar compounds with no hydrophilic groups may be used.

The hole transport layer 108 services to transport holes injected by the hole injection layer 107 to the light-emitting layer 109.

<Light-Emitting Layer>

The light-emitting layer 109 produces light through the recombination of carriers (i.e., the holes and the electrons) and includes organic material corresponding to each of three colours R, G, and B. The light-emitting layer 109 is formed individually in each aperture 106a of the partition layer 106, and is thus formed individually for each sub-pixel. The light-emitting layer 109 may use, for example, materials cited in Japanese Patent Application Publication No. H5-163488, such as an oxinoid compound, a perylene compound, a coumarin compound, an azacoumarin compound, an oxazole compound, an oxadiazole compound, a perinone compound, a pyrrolo-pyrrole compound, a naphthalene compound, an anthracene compound, a fluorene compound, a fluoranthene compound, a tetracene compound, a pyrene compound, a coronene compound, a quinolone compound and an azaquinolone compound, a pyrazoline derivative and a pyrazolone derivative, a rhodamine compound, a chrysene compound, a phenanthrene compound, a cyclopentadiene compound, a stilbene compound, a diphenylquinone compound, a styryl compound, a butadiene compound, a dicyanomethylene pyran compound, a dicyanomethylene thiopyran compound, a fluorescein compound, a pyrylium compound, a thiapyrylium compound, a selenapyrylium compound, a telluropyrylium compound, an aromatic aldadiene compound, an oligophenylene compound, a thioxanthene compound, a cyanine compound, an acridine compound, a metal complex of an 8-hydroxyquinoline compound, a metal complex of a 2-bipyridine compound, a complex of a Schiff base and a group three metal, a metal complex of oxine, a rare earth metal complex, and so on.

<Electron Transport Layer>

The electron transport layer 110 serves to transport electrons injected by the common electrode 112 to the light-emitting layer 109, and is made from OXD (an oxadiazole derivative), TAZ (a triazole derivative), BCP (a phenanthroline derivative, also termed Bphen), or similar.

<Electron Injection Layer>

The electron injection layer 111 promotes injection of electrons from the common electrode 112 to the light-emitting layer 109. The electron injection layer 111 is made from a metal having a small work function such as Li (lithium), Ba (barium), Ca (calcium), K (potassium), Cs (caesium), Na (sodium), Ru (rubidium), or similar, a metallic salt having a small work function such as lithium fluoride, or a metallic oxide having a small work function such as barium oxide.

<Common Electrode>

The common electrode 112 is provided in common for all sub-pixels, and is made from an light-transmissive material having electrically conductive properties, such as ITO (indium tin oxide), IZO (indium zinc oxide), or similar.

Although omitted from FIGS. 2A and 2B, a sealing layer, a black matrix, a colour filter, and so on may also be formed over the common electrode 112.

1-3. Layer Layout

The respective layouts of the TFT layer 102, the pixel electrode 104, the insulation film 105, and the partition layer 106 are described below.

Figure 3:
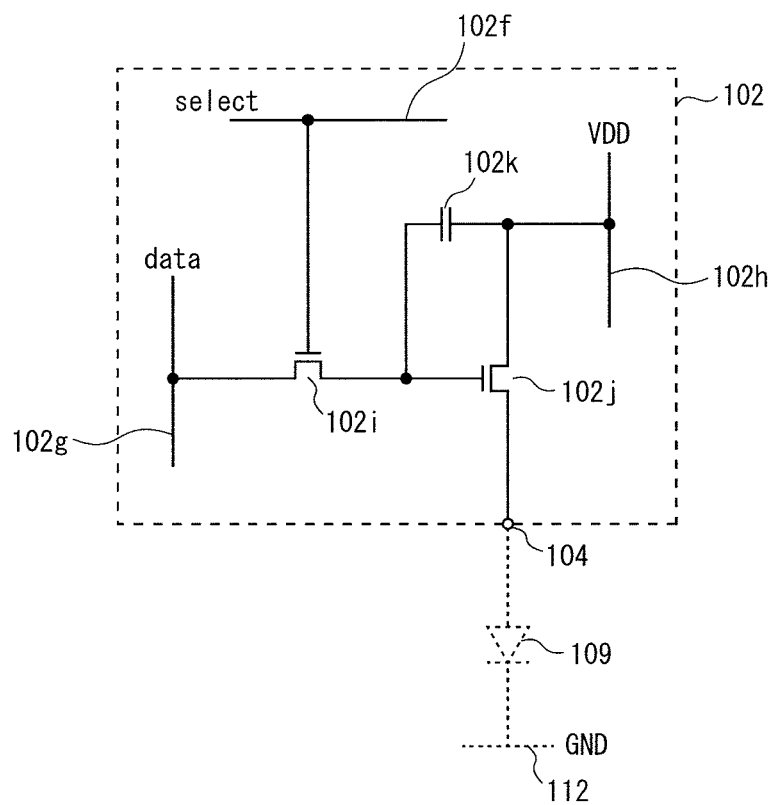
FIG. 3 is a circuit diagram illustrating a pixel circuit formed in a TFT layer.

FIG. 3 is a circuit diagram illustrating an example of a pixel circuit formed in the TFT layer 102. As shown, the pixel circuit includes a gate line 102f, a data line 102g, a power supply line 102h, a select transistor 102i, a drive transistor 102j, and a storage capacitor 102k. The select transistor 102i and the drive transistor 102j are TFT elements.

Figure 4:
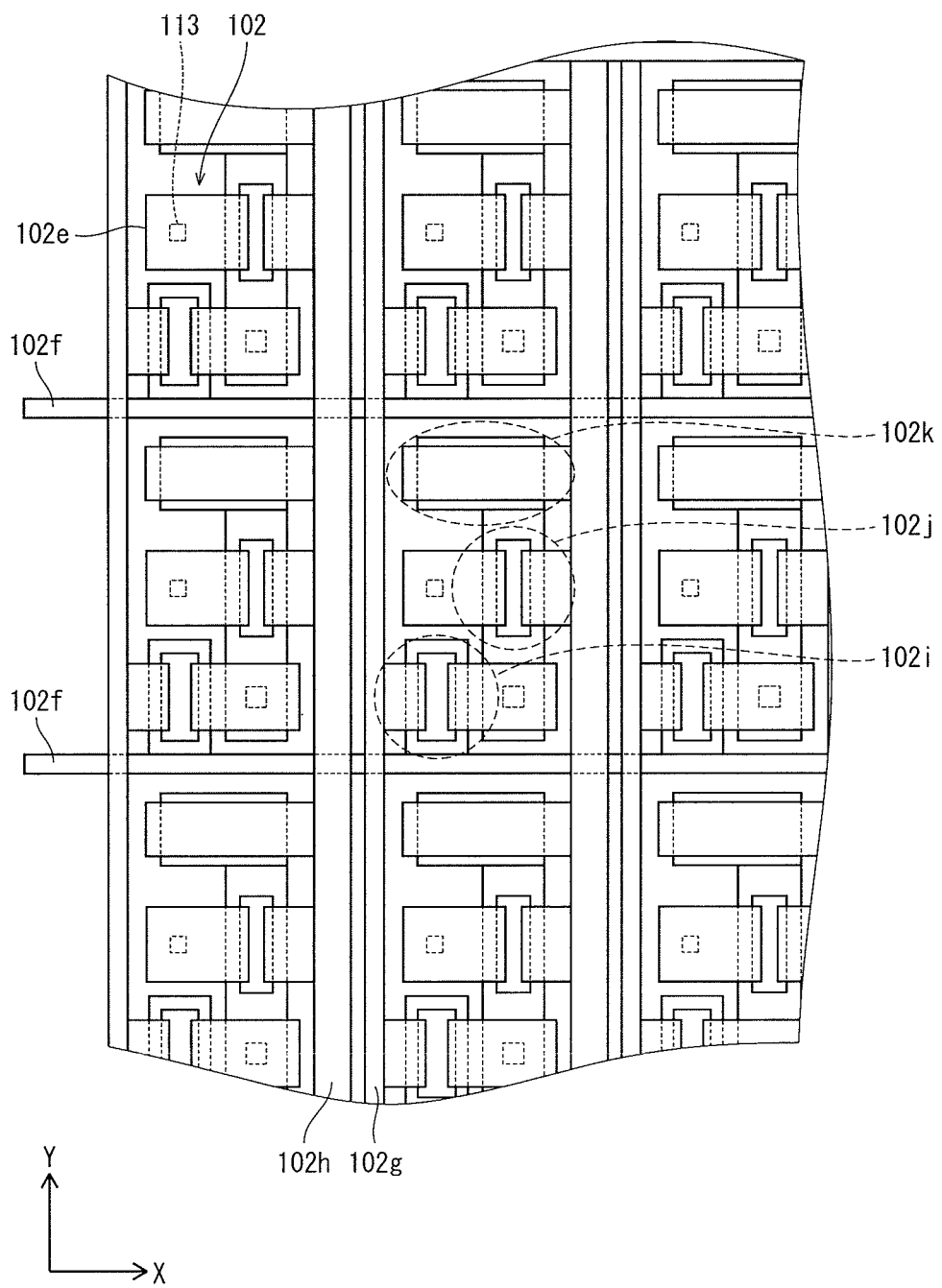
FIG. 4 is a plane-view diagram of the layout of the TFT layer.

FIG. 4 is a plane-view diagram of the layout of the TFT layer 102. The TFT layer 102 is formed in a region that is divided into a matrix having a row direction (i.e., an X direction) and a column direction (i.e., a Y direction).

As shown in FIG. 4, the gate line 102f is provided at each row, while the data line 102g and the power supply line 102h are provided at each column. The TFT layer 102 is formed individually in each division. As for an individual TFT layer 102, the select transistor 102i, the drive transistor 102j, and the storage capacitor 102k are formed in each division. The source-drain electrode of the drive transistor 102j is electrically connected to the extraction electrode 102e, and the extraction electrode 102e is electrically connected to the pixel electrode 104 via the contact hole 113.

The gate line 102f, the data line 102g, and the power supply line 102h are collectively termed power supply signal wiring. First power supply signal wiring is provided along the row direction (i.e., the X direction) and second power supply signal wiring is provided along the column direction (i.e., the Y direction). In the present Embodiment, the first power supply signal wiring corresponds to the gate line 102f, while the second power supply signal wiring corresponds to the data line 102g and the power supply line 102h.

Figure 5:
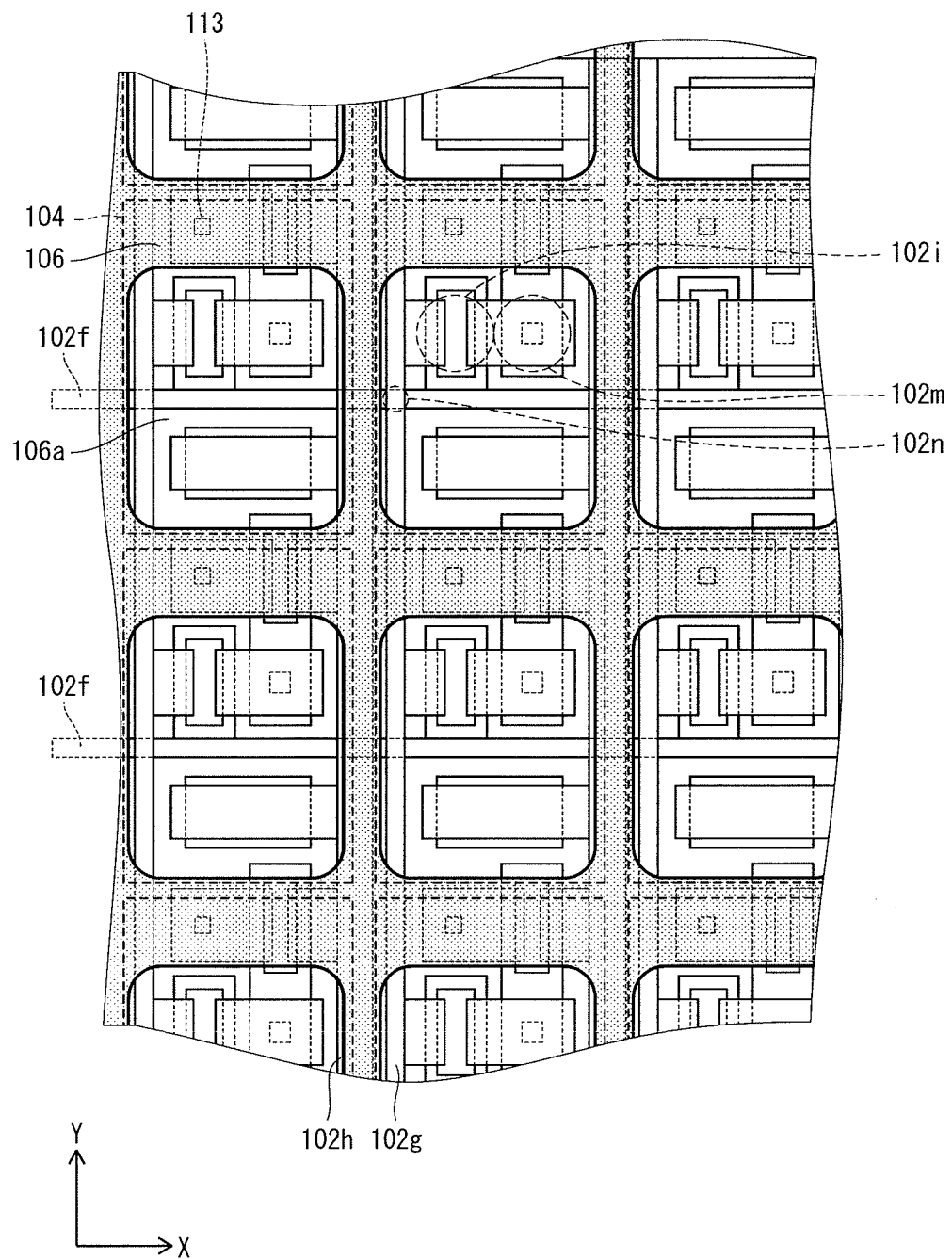
FIG. 5 is a plane-view diagram of the layout of a partition layer.

FIG. 5 is a plane-view diagram of the layout of the partition layer 106. The partition layer 106 is provided as a matrix having a row direction (i.e., the X direction) and a column direction (i.e., the Y direction), with the aperture 106a formed within each of the partitions. An individual aperture 106a is, for example, 70 μm in the row direction and 210 μm in the column direction.

Each aperture 106a has the select transistor 102i, an electrode wiring intersection portion 102m, and a power supply signal wiring intersection portion 102n arranged therein.

The electrode wiring includes wiring connecting the gate electrode and the source-drain electrode of the TFT and the power supply signal wiring, and wiring connecting the source-drain electrode of the select transistor 102i and the gate electrode of the drive transistor 102j. The gate electrode and the source-drain electrode may also serve as the electrode wiring. In the present Embodiment, the electrode wiring intersection portion 102m is a portion in which there is an intersection of the gate electrode of the drive transistor 102j, which is electrode wiring coplanar with the gate line (i.e., the first power supply signal wiring), and the source-drain electrode of the select transistor 102i, which is electrode wiring coplanar with the data line 102g (i.e., the second power supply signal wiring). An intersection occurs wherever one of the electrodes or wiring crosses and overlaps another one of the electrodes or wiring.

The power supply signal wiring intersection portion 102n is a portion in which the first power supply signal wiring and the second power supply signal wiring intersect within the power supply signal wiring. In the present Embodiment, the electrode wiring intersection portion 102m is a portion where the gate line 102f and the data line 102g intersect. Here, the first power supply signal wiring is the gate line 102f and the second power supply signal wiring is the data line 102g.

In FIG. 5, the pixel electrode 104 is indicated with a dashed line and treated as light-transmissive in order to show the layout of the TFT layer 102, below. The following description is made with reference to FIGS. 6, 13, 14A, and 14B.

FIG. 6 is a plane-view diagram of the layout of the insulation film 105. As shown, insulation film 105a is formed within the aperture 106a so as to cover corresponding portions above the select transistor 102i and the electrode wiring intersection portion 102m, and insulation film 105b is formed so as to cover corresponding portions above the power supply signal wiring intersection portion 102n.

As previously indicated, FIG. 2A is a cross-sectional diagram taken along line A-A' of FIG. 6, and FIG. 2B is a cross-sectional diagram taken along line B-B' of FIG. 6. In the present Embodiment, the partition layer 106 is formed over a portion of an edge of the insulation film 105b. However, no limitation is intended regarding the connection of the insulation film 105b and the partition layer 106. The respective layouts of the TFT array and the aperture 106a may involve forming the insulation films 105a and 105b at some separation from an aperture border 106b of the aperture 106a. Separation from the aperture border means insulation films 105a and 105b are not arranged below the partition layer 106, which makes partition layer height easier to keep even.

Within the TFT layer 102, large protrusions are produced where the electrodes and wiring intersect, namely by intersection of the TFT element, the electrode wiring intersection portion 102m, and the power supply signal wiring intersection portion 102n. As such, the surface of the inter-layer insulation layer 103 over such intersections is not completely planarized, which causes the protruding region 103b to form. The protruding region 103b is formed over any region where two or more components intersect, among at least the gate electrode 102a, the source electrode 102c, the drain electrode 102c, the gate line 102f, the data line 102g, and the power supply line 102h. The protruding region 103b may also be formed over a region where two or more TFT elements intersect, including at least the gate electrode 102a, the source electrode 102c, and the drain electrode 102c. Further, the protruding region 103b may also be formed over a region where two or more of at least the gate line 102f, the data line 102g, and the power supply line 102h intersect.

The pixel electrode 104, the light-emitting layer 109, and so on are layered over the inter-layer insulation layer 103. A portion of the light-emitting layer 109 formed over the protruding region 103b is thin, in comparison to the portion formed over the planar region 103a. The thin portion has lower electrical resistance and is thus prone to collecting electric charge. This promotes local degradation as more electrical current flows there, and may result in formation of a local non-light-emitting region. In the display panel 100 of the present Embodiment, the insulation film 105 is formed so as to cover corresponding portions above the protruding region 103b of the pixel electrode 104. Thus, electrical insulation is provided to prevent current flow between the pixel electrode 104 and the light-emitting layer 109 when the light-emitting layer 109 is formed in positions over the region where the insulation film 105 is formed. Accordingly, local degradation is constrained in the light-emitting layer 109 and a local non-light-emitting region is constrained from forming.

The insulation film 105 is thinner than the partition layer 106.

When the insulation film 105 is not provided, degradation advances in the light-emitting layer above the protruding region and produces a decrease in the amount of emitted light from the light-emitting element. In contrast, the present Embodiment provides the insulation film 105 and is thus able to constrain the decrease in the amount of emitted light, relative to conventional technology to which the same current is applied.

The protruding region could plausibly be covered by the partition layer 106. However, a configuration in which the partition layer 106 covers the region leaves only a small region for the aperture. When the region for the aperture is small, precisely dripping ink for the functional layers into the aperture becomes difficult. However, according to the present Embodiment, the insulation film 105 is present within the aperture as partitioned by the partition layer 106, rather than using the partition layer 106 itself. This allows a larger region to be used for the aperture and the functional layers to be formed more precisely even as higher resolution technology advances.

As described above, portions where the insulation film 105 provide electrical insulation such that current does not flow between the pixel electrode 104 and the light-emitting layer 109. However, this is not intended as a limitation requiring perfect insulation that completely prevents current flow, but also includes a certain degree of current flow. For example, when the electrical resistance of the insulation film 105 is greater than the electrical resistance of the hole injection layer 107, the current is constrained from flowing in the corresponding regions and provides a certain amount of constraint on the occurrence of local degradation.

Also, in the above Embodiment, the insulation film 105 is described as being formed over the entirety of the protruding region 103b. However, the insulation film 105 may also cover only a portion of the protruding region 103b.

Further, a plurality of distinct insulation films 105 may be formed over the protruding region 103b. For example, when regions that protrude are found in different areas of the aperture, the insulation film 105 may be formed over each protrusion in order to constrain reduction in light emitted through the aperture and to constrain the occurrence of non-light-emitting regions.

This concludes the description of the display panel 100 configuration. The following described an example of a manufacturing method for the display panel 100.

1-4. Manufacturing Method for Display Panel

Figure 7:
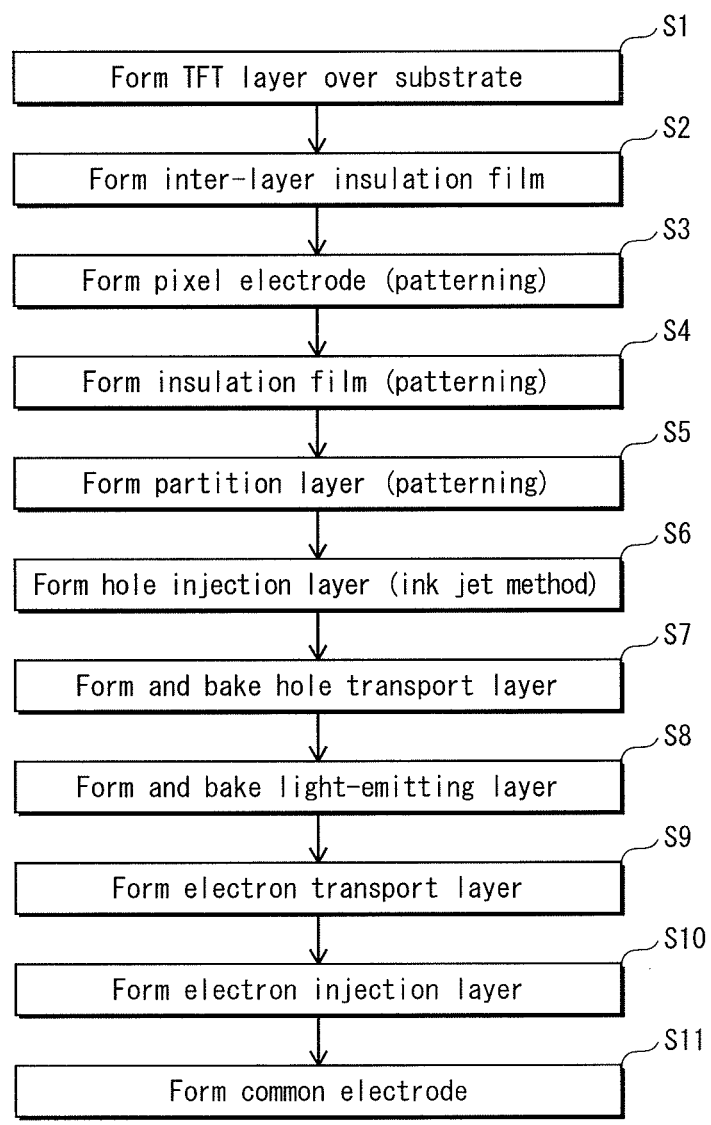
FIG. 7 is a schematic diagram indicating a manufacturing process for the display panel pertaining to the Embodiment.

The manufacturing method for the display panel 100 pertaining to the Embodiment is described with reference to FIGS. 7, 8A-8C, 9A, 9B, 10A, 10B, 11A, and 11B. FIG. 7 is a schematic diagram of the process involved in the manufacturing method of the display panel 100, and FIGS. 8A-8C, 9A, 9B, 10A, 10B, 11A, and 11B are partial cross-sectional diagrams schematically representing the manufacturing process for the display panel 100. FIGS. 8A-8C, 9A, 9B, 10A, 10B, 11A, and 11B illustrate the process of formation in the cross-section of FIG. 2A, selected as a representative example.

Figure 8A:
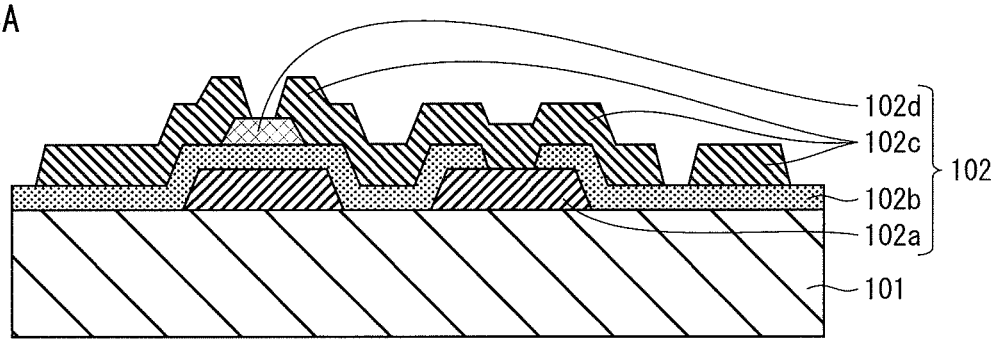
FIGS. 8A-8C are schematic cross-sectional diagrams indicating part of the manufacturing process for the display panel pertaining to the Embodiment, where

First, as shown in FIG. 8A, the substrate 101 is prepared with the TFT layer 102 formed thereon (step S1 in FIG. 7).

Figure 8B:
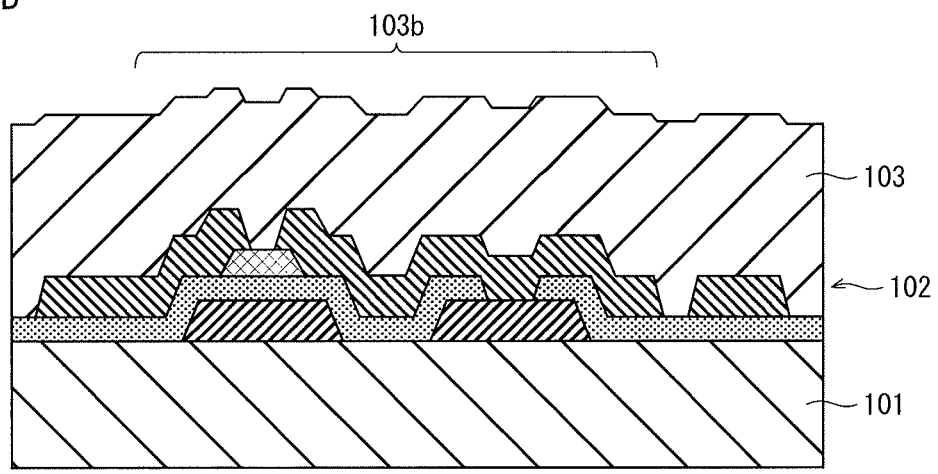

Afterward, as shown in FIG. 8B, an organic material with excellent insulating properties is used to form the inter-layer insulation layer 103 with a thickness of approximately 4 μm, based on a photoresist method (step S2 in FIG. 7).

As shown, the surface of the inter-layer insulation layer 103 has the protruding region 103b formed thereon in correspondence with surface irregularities of the TFT layer 102, below.

Figure 8C:
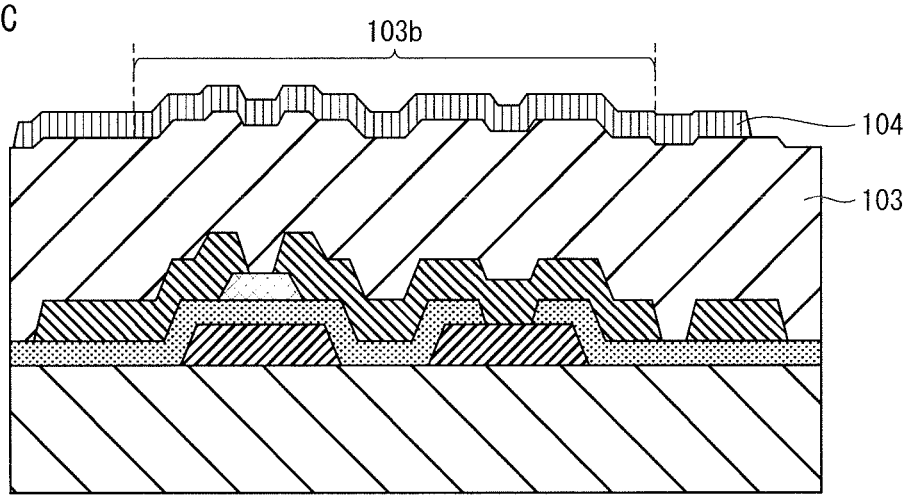

Next, as shown in FIG. 8C, the pixel electrode 104 is formed for each sub-pixel from a metal material, with a thickness on the order of 400 nm, based on a vacuum deposition method or a sputtering method (step S3 in FIG. 7).

Figure 9A:
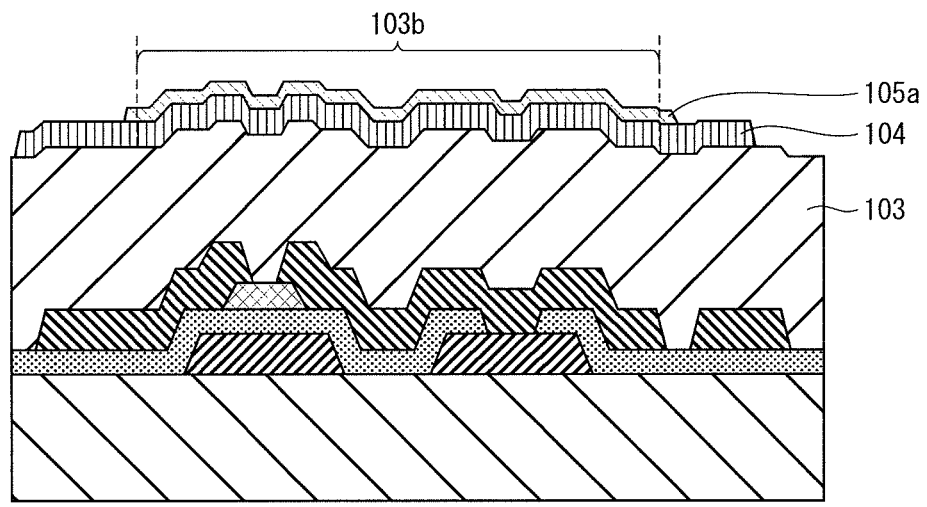
FIGS. 9A and 9B are schematic cross-sectional diagrams indicating part of the manufacturing process for the display panel pertaining to the Embodiment, where

Then, as shown in FIG. 9A, an organic material having good insulating properties is used to form the insulation film 105 over corresponding portions to the protruding region 103b of the pixel electrode 104, with a thickness of 10 μm to 100 μm, based on a photo-lithography method (step S4 in FIG. 7). Specifically, the following process of formation is used. First, an insulation film material is applied uniformly over the inter-layer insulation layer 103, in the form of a paste that includes a photosensitive resist material. A pattern mask is then superposed thereon, to match positions of the protruding region 103b. Next, the top of the mask is exposed to light to form an insulation film pattern. Afterward, an aqueous or non-aqueous etching solution (i.e., developing fluid) is used to wash off any dross from the insulation film material. The insulation film 105 is thus formed.

Here, when forming the TFT layer 102 in step S1 of FIG. 7, the position on the TFT array substrate at which the TFT element is formed, as well as any intersection thereof with an electrode or wiring, is known in advance. As such, the position where the protruding region 103b is known in advance, and the insulation film 105 need only be formed accordingly.

Also, when the insulation film 105 is formed from SiO (silicon oxide), SiN (silicon nitride), or a similar inorganic insulating material, the following method may be used. First, an inorganic insulating material layer is formed using CVD, sputtering, or a similar method, then a resist material is applied thereon, and patterning of the resist material is performed using a photo-lithography method, thus producing a finished resist. The finished resist is then used to perform patterning of the inorganic insulating material layer, through a wet etching or dry etching method, after which the resist is removed. Thus, the insulation film 105 is completed.

Figure 9B:
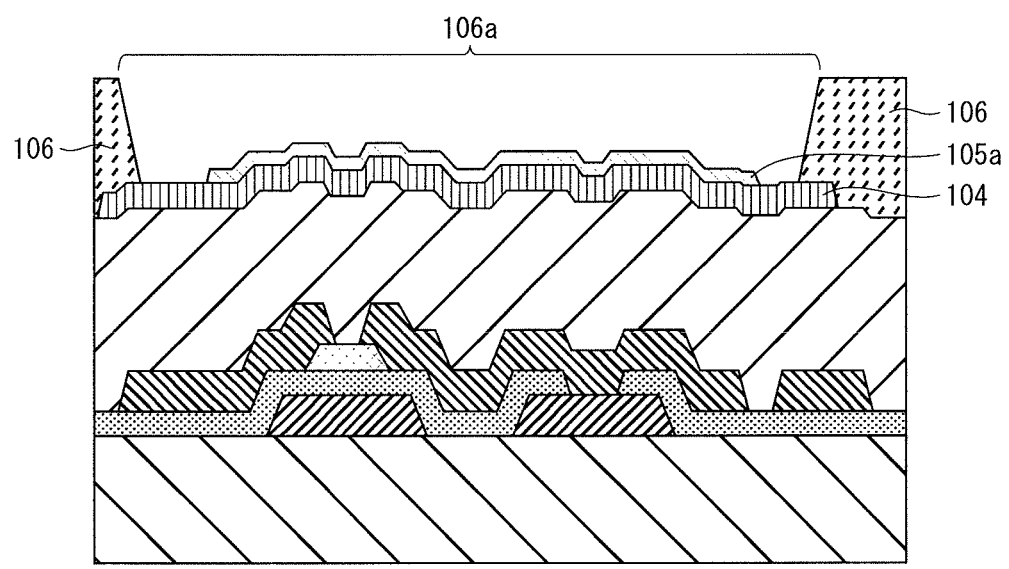

Subsequently, as shown in FIG. 9B, the partition layer 106 is formed based on the photo-lithography method. First, a partition layer material is prepared in paste form, such that the partition layer material includes a photosensitive resist material. The partition layer material is uniformly applied over the pixel electrode 104 and the insulation film 105. A mask is then superposed thereon, in the pattern of the aperture 106a shown in FIG. 5. Next, the top of the mask is exposed to light to form a partition layer pattern. Afterward, an aqueous or non-aqueous etching solution (i.e., developing fluid) is used to wash off any dross from the partition layer material. The patterning of the partition layer material is thus completed. The aperture 106a is thus defined so as to serve as a light-emitting layer formation region, and the partition layer 106 is completed with a liquid-repellent surface (step S5 in FIG. 7).

Figure 10A:
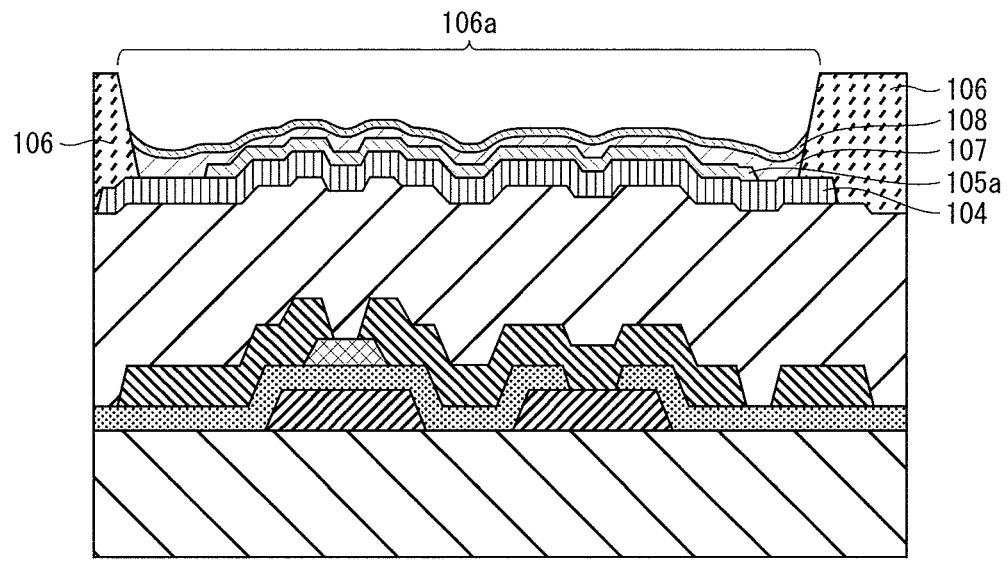
FIGS. 10A and 10B are schematic cross-sectional diagrams indicating part of the manufacturing process for the display panel pertaining to the Embodiment, where

Next, as shown in FIG. 10A, an inkjet method involving an electrically conductive polymer material such as PEDOT (a compound of polythiophene and polystyrene sulfonate) is employed to form the hole injection layer 107 by application inside the aperture 106a (step S6 in FIG. 7), and the inkjet method is also employed to form the hole transport layer 108 thereon (step S7 in FIG. 7).

Figure 10B:
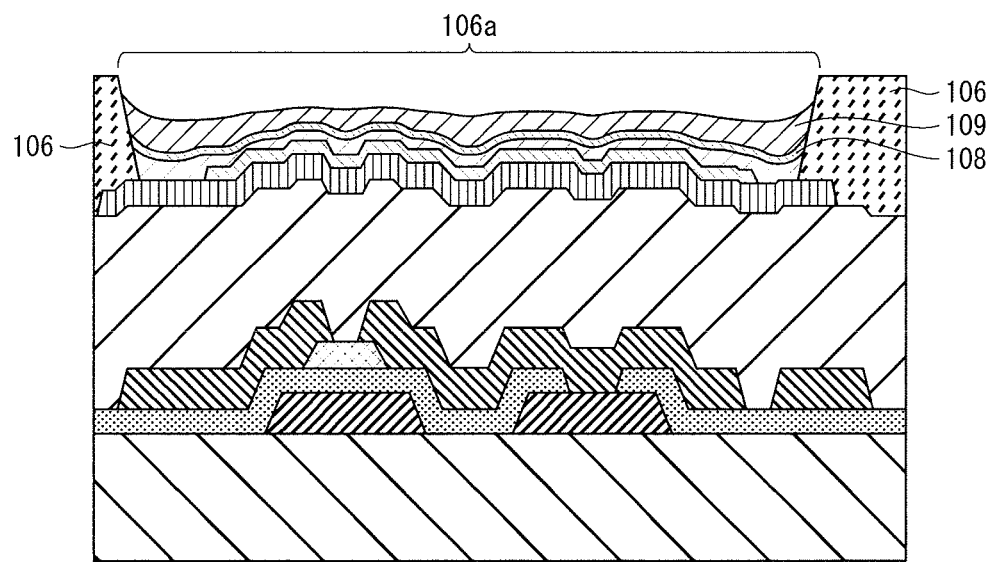

Then, as shown in FIG. 10B, the inkjet method is used to apply a light-emitting layer ink, which is a compound in which the organic material forming the light-emitting layer 109 and a solvent are mixed in predetermined proportions, within the aperture 106a. Afterward, evaporative drying is used on the solvent in the ink, and any necessary thermal baking is performed to form the light-emitting layer 109 (step S8 in FIG. 7).

Figure 11A:
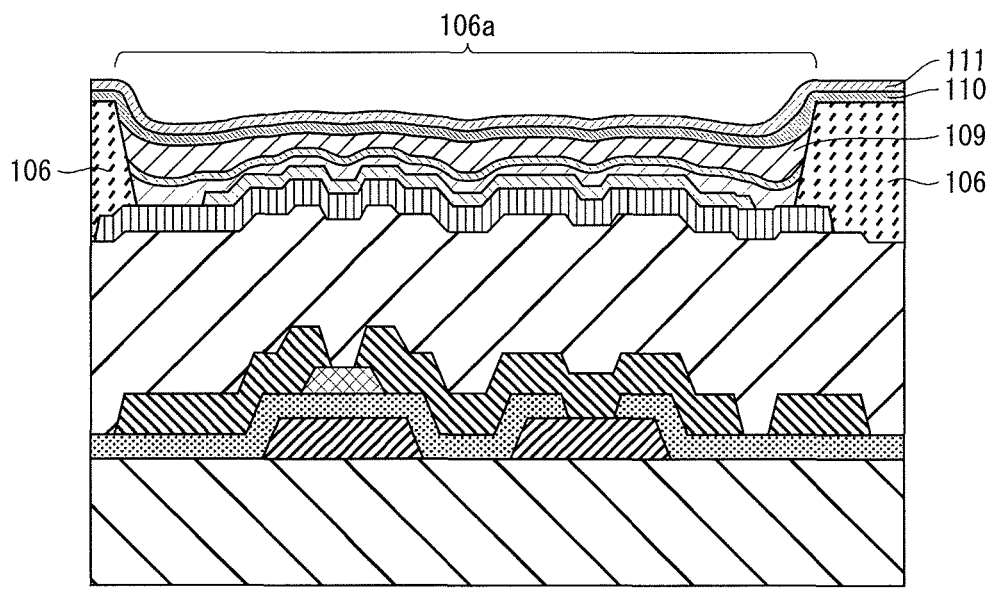
FIGS. 11A and 11B are schematic cross-sectional diagrams indicating a manufacturing process for the display panel pertaining to the Embodiment, where

Next, as shown in FIG. 11A, the material for the electron transport layer 110 is deposited as a film over the light-emitting layer 109 and the partition layer 106 according to a vacuum deposition method. Accordingly, the electron transport layer 110 is formed (step S9 in FIG. 7).

Subsequently, the electron injection layer 111 is formed as film of material using a deposition method, a spin coat method, a cast method, or similar (step S10 in FIG. 7).

Figure 11B:
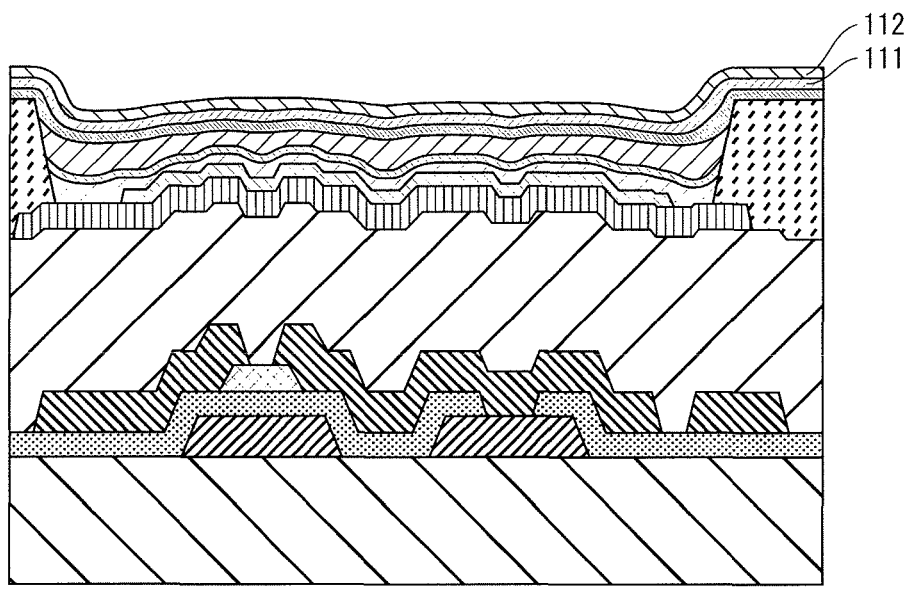

Then, as shown in FIG. 11B, a vacuum deposition method, a sputtering method, or similar is used to form a film of a material such as ITO (indium tin oxide) or IZO (indium zinc oxide). The common electrode 112 is thus formed (step S11 in FIG. 7).

Although not illustrated, a sealing layer is also formed over the surface of the common electrode 112 from a light-transmissive material such as SiN (silicon nitride), SiON (silicon oxynitride), or the like, using a sputtering method, a CVD method, or similar.

The display panel 100 is thus completed through the above-described process.

[Variations]

Although the disclosure has been described above in accordance with the Embodiment. However, the present disclosure is not limited in this manner. For example, the following variations may also be applied.

(1) In the above-described Embodiment, the insulation film 105 is formed over the pixel electrode 104. However, no such limitation is intended. For example, when the hole injection layer 107 is formed using a sputtering method or the like with an oxide of a metal such as Ag (silver), Mo (molybdenum), Cr (chromium), V (vanadium), W (tungsten), Ni (nickel), Ir (iridium), and so on, then the insulation film 105 may be formed over the hole injection layer 107 rather than over the pixel electrode 104.

In such a case, the hole injection layer 107 is formed over the pixel electrode 104 after the formation of the pixel electrode 104, and the partition layer 106 is subsequently formed over the hole injection layer 107.

Figure 12:
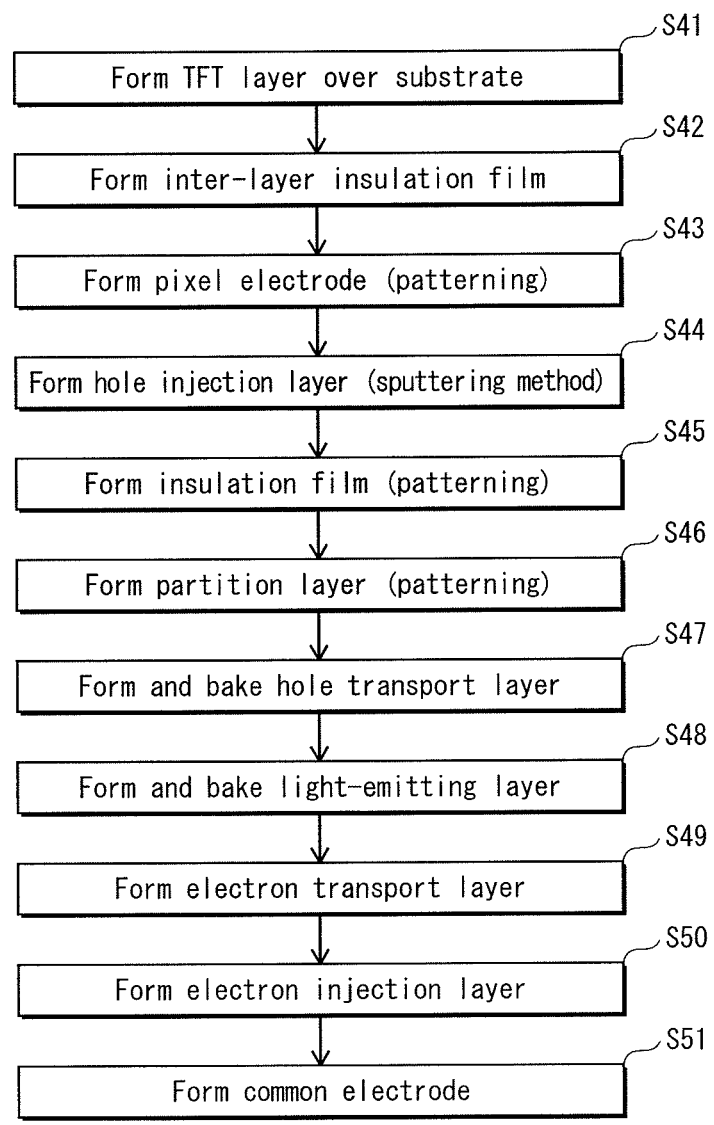
FIG. 12 is a schematic diagram indicating a manufacturing process for the display panel pertaining to Variation 1.

FIG. 12 is a schematic diagram of the process involved in the manufacturing method of the display panel pertaining to Variation 1. The following describes a case where Variation 1 is applied to the manufacturing method of the display panel of the Embodiment.

Steps S41-S43 of FIG. 12 are identical to steps S1-S3 of FIG. 7. Explanations of these steps are thus omitted.

After forming the pixel electrode 104 in step S43, the hole injection layer 107 is formed over the pixel electrode 104 using the sputtering method (step S44).

Next, the insulation film 105 is formed over a portion of the hole injection layer 107 corresponding to the protruding region 103b, with a thickness of 10 μm to 100 μm (step S45).

Afterward, the partition layer 106 is formed over the hole injection layer 107 and the insulation film 105 (step S46). The partition layer 106 is formed using the method described for step S5 in FIG. 7.

Subsequently, steps S47-S51 of FIG. 12 are performed, which are identical to steps S7-S11 of FIG. 7. Explanations of these steps are thus omitted.

Step S44 may also include a process of patterning the hole injection layer 107. Also, once the pre-patterned hole injection layer 107 has been formed over the pre-patterned pixel electrode 104, patterning of the pixel electrode 104 and the hole injection layer 107 may be performed in one step.

(2) The insulation film 105 need only constrain the supply of holes or of electrons to avoid corresponding portions, above the protruding region 103b, of the light-emitting layer 109. As such, the insulation film 105 need not necessarily be always formed between the pixel electrode 104 and the light-emitting layer 109. For example, the insulation film 105 may be formed on any of the layers between the light-emitting layer 109 and the common electrode 112. When the insulation film 105 is formed below the light-emitting layer 109, the thickness distribution of the light-emitting layer 109 may be negatively influenced in the vicinity of edges of the insulation film 105. However, forming the insulation film 105 above the light-emitting layer 109 serves to eliminate such negative influence.

Figure 13:
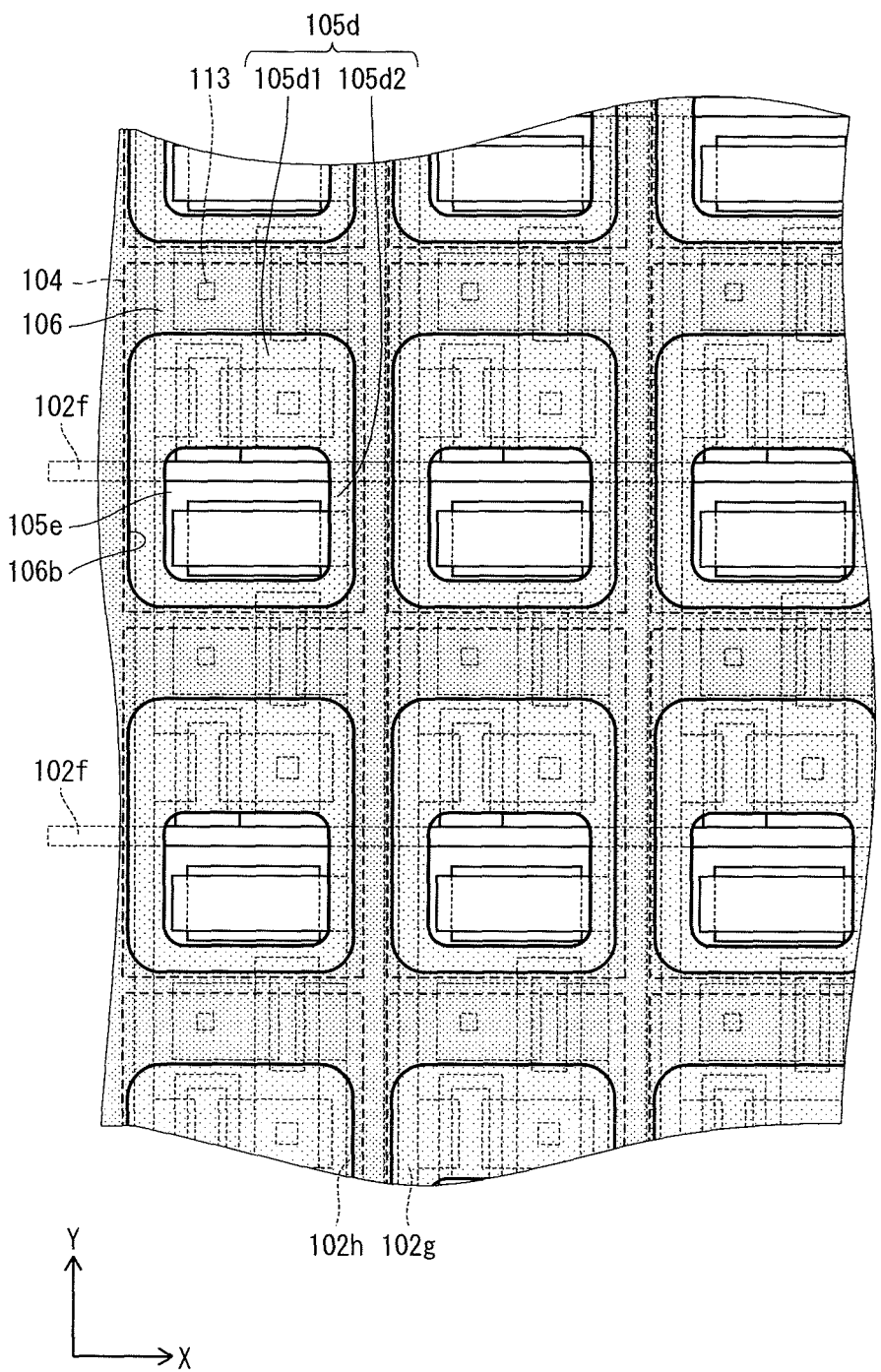
FIG. 13 is a plane-view diagram of the layout of an insulation film in the display panel pertaining to Variation 3.

(3) In the Embodiment, the insulation film 105 is formed so as to cover only corresponding portions over the protruding region 103b. However, no such limitation is intended. For example, as shown in FIG. 13, the insulation film 105d may include a main insulation film 105d1 formed normally in the corresponding portions over the protruding region, and a peripheral insulation film 105d2 formed along the aperture border 106b in the aperture 106a. In the present Variation, the peripheral insulation film 105d2 is formed so as to be incorporated with the main insulation film 105d1 (i.e., corresponding to the insulation films 105a and 105b). As shown in FIG. 13, an insulation film aperture 105e is formed in the aperture 106a.

The partition layer 106 is formed as a wall at the aperture border 106b of the aperture 106a. When the ink that includes the material for the light-emitting layer 109 is applied within the aperture 106a and subsequently dried to form the light-emitting layer 109, any ink that is in contact with a wall surface of the bank may be influenced by liquid repellence or wettability of the wall surface, such that the film may be uneven near the periphery of the light-emitting layer 109 as formed. In the present Variation, the insulation film is additionally formed along the aperture border 106b. Thus, current is prevented from flowing in the aforementioned portions of the film that are prone to unevenness, which enables local formation of a non-light-emitting region, caused by local degradation of a corresponding portion, to be constrained.

(4) A display panel such as the organic EL panel has organic EL elements respectively corresponding to sub-pixels in red (R), green (G), and blue (B). A combination of three sub-pixels R, G, and B forms one pixel. However, the respective organic materials used to form the light-emitting layer of each colour R, G, and B do not have the same light emission efficiency. Typically, the organic material for green has the highest light emission efficiency, while the organic material for blue has the lowest light emission efficiency. Accordingly, a blue light-emitting layer 109 (B) must be supplied with greater drive current than a red light-emitting layer 109 (R) and a green light-emitting layer 109 (G). Likewise, the red light-emitting layer 109 (R) must be supplied with greater current than the green light-emitting layer 109 (G). Accordingly, the TFT element and the electrode wiring arranged below the blue light-emitting layer 109 (B) may be larger than the respective TFT elements and electrode wiring arranged below the red light-emitting layer 109 (R) and the green light-emitting layer 109 (G). Similarly, the TFT element and the electrode wiring arranged below the red light-emitting layer 109 (R) may be larger than the TFT element and the electrode wiring arranged below the green light-emitting layer 109 (G). In such circumstances, the protruding region formed at the light-emitting region of a blue sub-pixel is larger than the protruding region formed at the respective light-emitting regions of red and green sub-pixels, and likewise, the protruding region formed at the light-emitting region of the red sub-pixel is larger than the protruding region formed at the light-emitting region of the green sub-pixel. Accordingly, the surface area where local degradation may occur is greatest at the blue light-emitting layer 109 (B), next-greatest at the red light-emitting layer 190 (R), and smallest at the green light-emitting layer 109 (G).

For example, when a corresponding region over the protruding region of the blue light-emitting layer 109 (B) has portions not covered by the insulation film, then local degradation of the light-emitting layer may occur. In such a case, as local degradation progresses, a non-light-emitting region is formed only at the blue light-emitting layer 109 (B). As a result, the white balance of the display panel may become unstable.

Figure 14A:
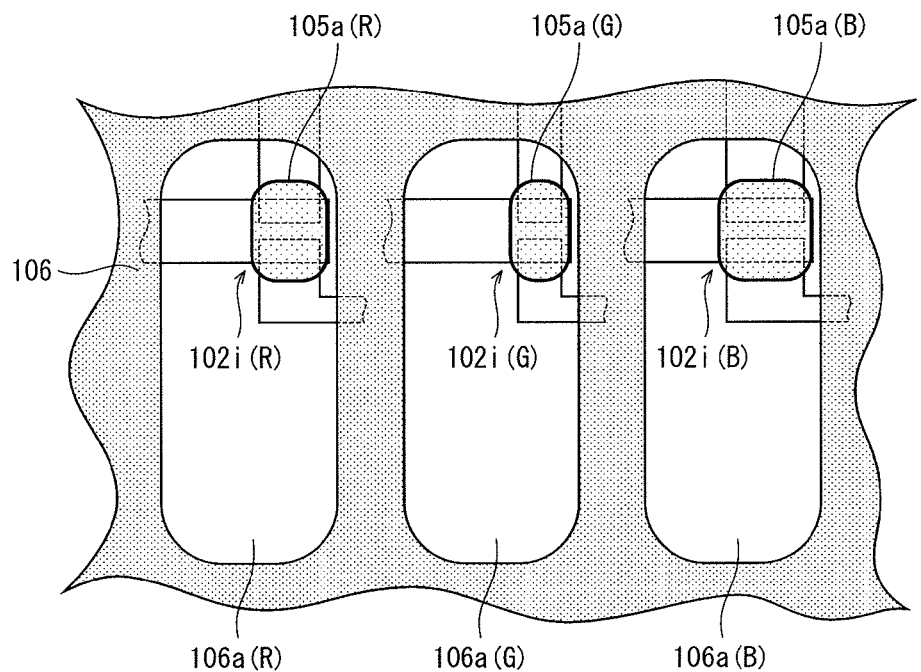
FIG. 14A is a plane-view diagram of the layout of an insulation film in the display panel pertaining to Variation 4.

As shown in FIG. 14A, due to the size of the protruding region formed at a sub-pixel light-emitting region of each colour, the insulation film may be formed such that an insulation film 105a for blue (B) formed at the sub-pixel light-emitting region in aperture 106a (B) in the blue light-emitting layer 109 (B) is largest, while an insulation film 105a for green (G) formed at the sub-pixel light-emitting region in aperture 106a (G) in the green light-emitting layer 109 (G) is smallest.

Accordingly, variability in intensity of local degradation is constrained between the light-emitting regions of the sub-pixels, which enables prevention of white balance instability.

The insulation film may also be formed so as to be of the same size in each sub-pixel light-emitting region of all colours R, G, and B, matching the size of the protruding region formed in the sub-pixel light-emitting region of the blue sub-pixel. However, this is not beneficial given that the light-emitting region of the red and green sub-pixels is thus covered with the insulation film in corresponding portions above the planar region, where no problems occur with emitted light. This approach thus invites waste by needlessly decreasing the amount of emitted light.

In the above-described example, the blue light-emitting layer 109 (B) is described as having the greatest drive current supplied thereto. However, no such limitation is intended. The aperture in which is formed a transistor supplying the most drive current among the three colours (or more than three colours when additional colours are used) may be formed so as to have an insulation film having a larger surface area than the aperture in which are formed the other light-emitting layers.

Also, in a plan view, the insulation film having the largest surface area may be formed in the aperture in which is formed the transistor having the largest surface area.

Also, the size of the insulation layer may be changed in accordance with light emission efficiency rather than in accordance with colour of emitted light. That is, a light-emitting layer with the greatest light emission efficiency may be formed so as to have a larger insulation layer positioned in the aperture thereof.

Figure 14B:
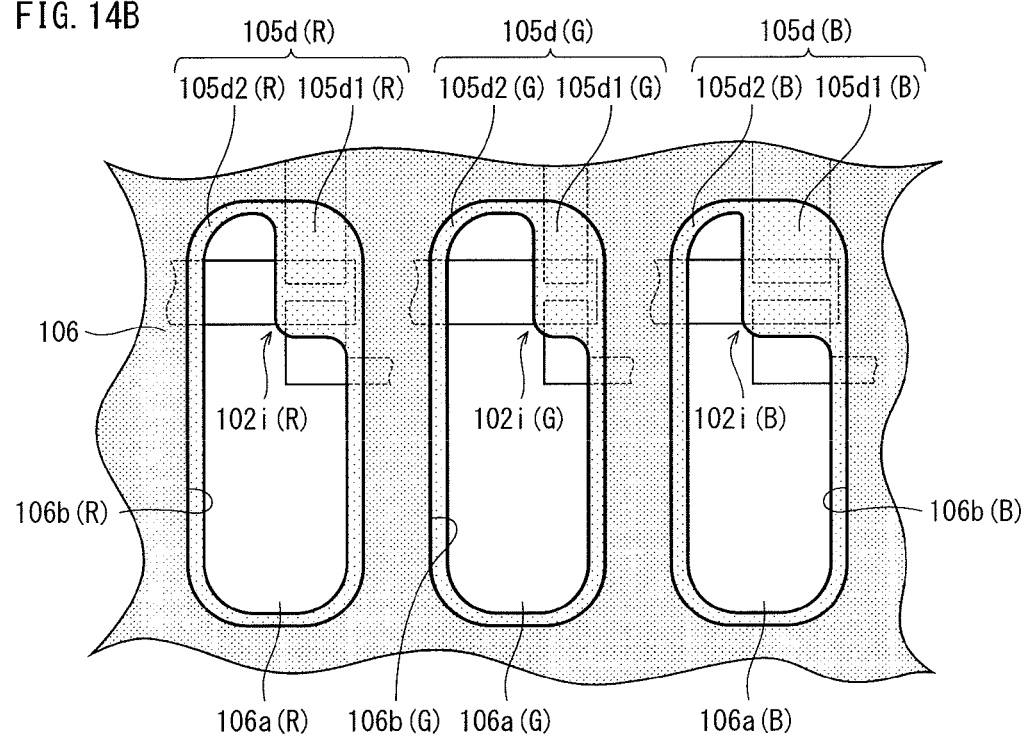
FIG. 14B is a plane-view diagram of the layout of an insulation film in the display panel pertaining to Variation 5.

(5) In Variation 4, when the size of the insulation film formed in the respective light-emitting region of the R, G, and B sub-pixels in accordance with colour of emitted light, then as shown in FIG. 14B, the peripheral insulation film 105d2 may be formed along the aperture border 106b in addition to the main insulation film 105d1 formed so as to cover the corresponding portion over the protruding region of each colour. In such a situation, the effects of Variation 3 are obtained in addition to the effects of Variation 4.

(6) In FIGS. 2A and 2B, the layer configuration of the layers above the substrate, namely the TFT layer 102 through the common electrode 112, is illustrated. The present disclosure is also applicable to cases where any of these layers is absent, other than the electrodes and the light-emitting layer, and to cases where another layer is added, such as a light-transmissive electrically conductive layer.

(7) In FIG. 13, the insulation film 105 is continuous with the edges of the partition layer 106. In the present disclosure, the insulation film 105 may also be separated from the partition layer 106.

INDUSTRIAL APPLICABILITY

The display panel and manufacturing method of the present disclosure are beneficially applicable to, for instance, various types of devices used in private homes, in public installations, or in commercial settings, including a display device, a television, a display for a portable electronic device, and so on.

LIST OF REFERENCE SIGNS

1 Display device
100, 200 Display panel
101 Substrate
102 TFT layer
102a Gate electrode
102b Gate insulation layer
102c Source electrode, drain electrode, source-drain electrode
102d Channel layer
102e Extraction electrode
102f Gate line
102g Data line
102h Power supply line
102i Select transistor
102j Drive transistor
102k Storage capacitor
102m Electrode wiring intersection portion
102n Power supply signal wiring intersection portion
103 Inter-layer insulation layer
103a Planar region
103b Protruding region
104 Pixel electrode
105, 105a, 105b, 105d Insulation film
105d1 Main insulation film
105d2 Peripheral insulation film
105e Insulation film aperture
106 Partition layer
106a Aperture
106b Aperture border
107 Hole injection layer
108 Hole transport layer
109 Light-emitting layer
110 Electron transport layer
111 Electron injection layer
112 Common electrode
113 Contact hole

The invention claimed is:
1. A display panel, comprising:
a transistor array in which a plurality of drive units each including a thin-film transistor are arranged in a matrix, the thin-film transistor including a gate electrode, a gate insulation film opposite the gate electrode, a semiconductor layer opposite the gate electrode across the gate insulation film, and a pair of a source electrode and a drain electrode electrically connected to the semiconductor layer;

an inter-layer insulation layer arranged above the transistor array;

a partition layer arranged above the inter-layer insulation layer and partitioning a plurality of apertures in the matrix;

a pixel electrode arranged above the inter-layer insulation layer for each of the apertures;

a light-emitting layer arranged above the pixel electrode in each of the apertures; and an insulation film arranged between the pixel electrode and the light-emitting layer, wherein the transistor array includes first power supply signal wiring arranged in a row direction and second power supply signal wiring arranged in a column direction, within at least one of the apertures, the inter-layer insulation layer includes a planar region having a planar surface and a protruding region having a protruding surface, relative to the planar region, located wherever two or more of the gate electrode, the drain electrode, the source electrode, the first power supply signal wiring, and the second power supply signal wiring intersect, and the insulation film covers at least part of the protruding region and does not cover at least part of the planar region.

2. The display panel of claim 1, wherein when a position on the light-emitting layer located above the planar region is illuminated, a position on the light-emitting layer located above the insulating layer is non-illuminated.

3. The display panel of claim 1, wherein the protruding region is located where the first power supply signal wiring and the second power supply signal wiring intersect, or where electrode wiring that is co-planar with the first power supply signal wiring and electrode wiring that is co-planar with the second power supply signal wiring intersect.

4. The display panel of claim 1, wherein the protruding region is located above a position where two or more of the gate electrode, the drain electrode, and the source electrode intersect.

5. The display panel of claim 1, further comprising a hole injection layer between the pixel electrode and the light-emitting layer, wherein the insulation film is arranged between the pixel electrode and the hole injection layer.

6. The display panel of claim 1, further comprising a hole injection layer between the pixel electrode and the light-emitting layer, wherein the insulation film is arranged over the hole injection layer.

7. The display panel of claim 1, wherein the insulation film is separated from the apertures, as seen in a plan view.

8. The display panel of claim 1, wherein the insulation film is thinner than the partition layer, and is continuous with an aperture border, as seen in a plan view.

9. The display panel of claim 1, wherein the apertures include:

a first aperture in which is disposed a first light-emitting layer emitting light of a first colour; and a second aperture in which is disposed a second light-emitting layer emitting light of a different colour than the first light-emitting layer and having greater light emission efficiency than the first light-emitting layer, and as seen in a plan view, the insulating film has a larger surface area in the first aperture relative to the second aperture.

10. The display panel of claim 1, wherein the light-emitting layer disposed in each of the apertures emits a colour of light that is one of red, blue, and green, and as seen in a plan view, the insulating film has a larger surface area in one of the apertures in which is disposed the light-emitting layer that emits blue light, relative to the aperture in which is disposed the light-emitting layer that emits one of red light and green light.

11. The display panel of claim 10, wherein as seen in a plan view, the insulating film has a larger surface area in one of the apertures in which is disposed the light-emitting layer that emits red light, relative to the apertures in which is disposed the light-emitting layer that emits green light.

12. A manufacturing method for a display panel, comprising:

preparing a substrate;

forming a transistor array substrate by arranging a plurality of drive units, each including a thin-film transistor, in a matrix on the substrate, the thin-film transistor including a gate electrode, a gate insulation film opposite the gate electrode, a semiconductor layer opposite the gate electrode across the gate insulation film, and a pair of a source electrode and a drain electrode electrically connected to the semiconductor layer;

forming an inter-layer insulation layer above the transistor array substrate;

forming a plurality of pixel electrodes above the inter-layer insulation layer, each pixel electrode corresponding to one of the drive units in the matrix;

forming an insulation film above the pixel electrodes and over part of the inter-layer insulation layer;

forming a partition layer above the inter-layer insulation layer and the insulation film partitioning a plurality of apertures respectively corresponding to the pixel electrodes; and forming a light-emitting layer arranged above the insulation film in each of the apertures, wherein the transistor array includes first power supply signal wiring arranged in a row direction and second power supply signal wiring arranged in a column direction, within at least one of the apertures, the inter-layer insulation layer includes a planar region having a planar surface and a protruding region having a protruding surface, relative to the planar region, located wherever two or more of the gate electrode, the drain electrode, the source electrode, the first power supply signal wiring, and the second power supply signal wiring intersect, and the insulation film covers at least part of the protruding region and does not cover at least part of the planar region.

13. The manufacturing method for the display panel of claim 12, wherein when a position on the light-emitting layer located above the planar region is illuminated, a position on the light-emitting layer located above the insulating layer is non-illuminated.

14. The manufacturing method for the display panel of claim 12, wherein the protruding region is located where the first power supply signal wiring and the second power supply signal wiring intersect.

15. The manufacturing method for the display panel of claim 12, wherein
    the protruding region is located above a position where two or more of the gate electrode, the drain electrode, and the source electrode intersect.

16. The manufacturing method for the display panel of claim 13, wherein
    the insulation film is thinner than the partition layer, and is continuous with an aperture border, as seen in a plan view.

17. The manufacturing method for the display panel of claim 12, wherein
    the apertures include:
        a first aperture in which is formed a first light-emitting layer emitting light of a first colour; and
        a second aperture in which is formed a second light-emitting layer emitting light of a different colour than the first light-emitting layer and having greater light emission efficiency than the first light-emitting layer, and
    as seen in a plan view, the insulating film has a larger surface area in the first aperture relative to the second aperture.

18. The manufacturing method for the display panel of claim 12, wherein
    the light-emitting layer formed in each of the apertures emits a colour of light that is one of red, blue, and green, and
    as seen in a plan view, the insulating film formed so as to cover a protruding region intended for formation of the light-emitting layer that emits blue light has a larger surface area than the insulating film formed so as to cover a predetermined protruding region intended for formation of the light-emitting layer that emits one of red light and green light.

19. The manufacturing method for the display panel of claim 12, wherein
    as seen in a plan view, the insulating film formed so as to cover a predetermined protruding region intended for formation of the light-emitting layer that emits red light has a larger surface area than the insulating film formed so as to cover a predetermined protruding region intended for formation of the light-emitting layer that emits green light.

\* \* \* \* \*